(12) United States Patent
Schneider (10) Patent No.: US 6,377,633 B1
(45) Date of Patent: Apr. 23, 2002

(54) APPARATUS AND METHOD FOR DECODING ASYNCHRONOUS DATA

(75) Inventor: David F. Schneider, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/169,517

(22) Filed: Oct. 9, 1998

(51) Int. Cl.[7] .......................... H04L 25/06; H03K 5/153
(52) U.S. Cl. ......................................... 375/317; 327/58
(58) Field of Search ................................. 375/317, 341, 375/377, 262, 319; 327/58, 60, 62

(56) References Cited

U.S. PATENT DOCUMENTS

| 2,999,925 | A |   | 9/1961  | Thomas            |         |
|-----------|---|---|---------|-------------------|---------|
| 3,736,511 | A |   | 5/1973  | Gibson            |         |
| 4,270,208 | A |   | 5/1981  | MacDavid          |         |
| 4,458,322 | A |   | 7/1984  | Veale             |         |
| 4,479,266 | A |   | 10/1984 | Eumurian et al.   |         |
| 4,540,897 | A |   | 9/1985  | Takaoka et al.    |         |
| 4,823,360 | A |   | 4/1989  | Tremblay et al.   |         |
| 4,926,442 | A |   | 5/1990  | Bukowski et al.   |         |
| 5,052,021 | A |   | 9/1991  | Goto et al.       |         |
| 5,180,931 | A |   | 1/1993  | Harada            |         |
| 5,315,164 | A | * | 5/1994  | Broughton         | 327/175 |
| 5,627,860 | A |   | 5/1997  | McKinney et al.   |         |
| 5,706,222 | A |   | 1/1998  | Bonaccio et al.   |         |
| 5,724,035 | A |   | 3/1998  | Sakuma            |         |
| 6,134,279 | A | * | 10/2000 | Soichi et al.     | 375/341 |
| 6,151,150 | A | * | 11/2000 | Kikuchi           | 359/194 |
| 6,242,908 | B1| * | 6/2001  | Scheller et al.   | 324/207.2 |

* cited by examiner

*Primary Examiner*—Chi Pham
*Assistant Examiner*—Khai Tran
(74) *Attorney, Agent, or Firm*—Allen, Dyer, Doppelt, Milbrath & Gilchrist, P.A.

(57) ABSTRACT

An apparatus and method for digitally decoding an asynchronous data signal is disclosed. Analog communication signals are converted into binary signal values. A negative peak register and a positive peak register store the negative and positive peak signal values corresponding to the negative and positive peak signal values of the analog communication signal. A negative peak comparator and a positive peak comparator compares the positive and negative signal peaks of the currently received binary signal value with minimum negative and maximum positive peak signal values stored within the negative and positive peak registers, and updates the negative and positive peak registers with any new minimum negative and maximum positive peak signal values. A subtraction circuit subtracts the positive peak signal value from the negative peak signal value to determine the magnitude signal value corresponding to the difference between a binary zero and one. An addition circuit adds one-half of the magnitude signal value to the minimum negative peak signal value stored in the negative peak register to obtain a threshold signal value, which is then used to determine the mid-point reference.

39 Claims, 4 Drawing Sheets

APPARATUS AND METHOD FOR DECODING ASYNCHRONOUS DATA

FIELD OF THE INVENTION

This invention relates to the field of asynchronous data communications, and more particularly, this invention relates to the field of decoding asynchronous digital data that is sent over a wire line, radio, or fiber optic communication channel.

BACKGROUND OF THE INVENTION

Figure 1:
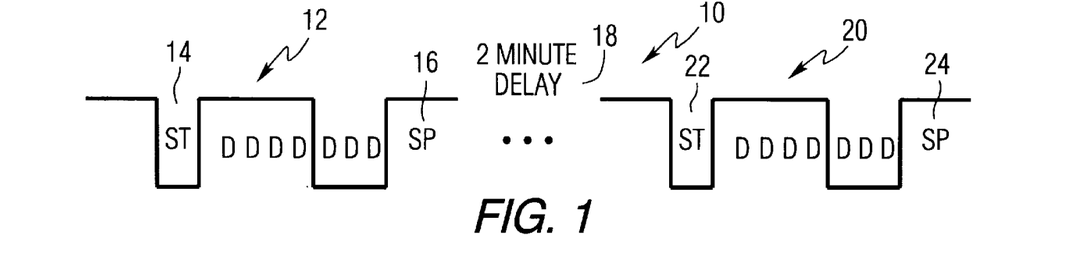
FIG. 1 is a representation of an asynchronous communication data transmission that shows a first frame transmission having a start and stop bit and data located between the start and stop bit followed by a two minute delay, and followed, in turn, by a second frame transmission.

Asynchronous communication systems are commonly used where data is not time oriented and is sent in bursts and received often in a burst receiver. In order to decode incoming data correctly, knowledge of the data amplitude should be ascertained in order to establish a reference within a communications receiver. Any receiver also should typically be capable of performing DC signal restoration during potentially long "quiet" periods. An example of a "quiet" period is shown in FIG. 1, where a frame of data has a stop bit, intermediate data (represented by the letter D) and a stop bit, followed by a two minute signal delay, followed by another frame of data with a start and stop bit and intermediate data (D).

Asynchronous digital data is often sent over a wire line, radio link, or fiber optic communication channel. In some prior art systems, analog implementations have been used for decoding the asynchronous signals. Typically, decoding circuits have been designed to take into consideration the length of a communication line or the link loss. In this type of system, the circuit will restore an analog signal to obtain a digital signal value and then make a decoding decision on the digital signal value. Typically, the circuit is designed based on knowledge of the difference in data amplitude coming into a communications receiver, such as in a fiber optic communications system.

In some prior art applications where the link distance is still known with certainty, the receiver could move even if the transmission distance and theoretical amount of attenuation is known. However, the link loss would not be known and the signal strength could be variable. In some prior art asynchronous communication systems, designers typically would know the distance between a transmitter and receiver. For example, the communication line could be from room-to-room, or from city-to-city. Once this link distance is known, then the circuit is designed based on the theoretical amount of signal attenuation. However, there are often times when the amount of signal attenuation cannot be known in a communication line. Also DC signal restoration is difficult.

One of the key aspects of asynchronous data communication is the transmittal of packets or frames. Typically, a burst receiver may be used as mentioned before. In many prior art burst receivers, the receiver will lose its DC reference over a time pause in signal communication, which is why many communication systems use Manchester encoding or pseudo random number generation.

An example of one problem with DC signal restoration is comparing the difference between transmitting asynchronous data over three feet of cable between two computers in the same room, as compared to a longer distance system. In the asynchronous data communication system, if logical 1 corresponds to five volts and logical 0 corresponds to zero volts, there would be little problem in finding the midpoint reference or threshold when the data signal is transmitted through only three to five feet of cable. However, it the data signal is transmitted through 100 miles of cable, then the final attenuation would be great and the final signal could be about 100 millivolts. If the ideal threshold was set when only the three foot cable were used (i.e., a threshold of 2.5 volts), that threshold would be insufficient for the 100 mile transmission length and the threshold value would have to be lowered to about 50 millivolts. Thus, it is evident why the threshold in the most basic prior art asynchronous data communication system was set based on the transmission distance.

Some analog devices that are used for measuring the signal attenuation and setting a signal threshold in a receiver have been implemented with asynchronous data communications, but these systems do not accomplish high dynamic range burst mode asynchronous data decisions because of thermal drifts and parasitic effects of passive and active components.

Other common prior art methods have also been used to establish a signal reference in asynchronous data communication systems.

In a preamble system, several disposable data bits are sent prior to a data payload having the start bit to allow a decision circuit in the communications receiver to establish a signal reference, Thus, as soon as a start bit is transmitted, the circuitry has measured both zero and one logic levels and has set a threshold half-way between the zero and one logic levels.

In a second method known as "avoidance of risk mode of operation," a continuous stream of data is sent with an even mix of ones and zeros by using a randomizing circuit. To avoid a long quiet period, which sometimes occurs such as a two minute delay as shown in FIG. 1, the data is multiplied by a pseudo random number in the transmitter to ensure the data stream is rich in data transitions. Thus, there will always be ones and zeros that are transmitted. Then the communications receiver circuitry decodes the pseudo random number and extracts the information.

In another method known as automatic gain control (AGC), a constant automatic gain control circuit controls the communications receiver gain. For example, if the transmission line is 100 miles long and there is a 100 millivolt threshold, then the signal will be amplified back to five volts. As a result, the system would use a 2.5 volt reference. However, there are time constants. If the system is quiet for extended periods, for example, about two minutes or some other time period, then the signal will decay and there is no signal information on which to make a gain or adjustment of the signal. Thus, the DC signal information is not present.

It is evident that the prior art methods are not adequate in some circumstances. For example, the preamble system reduces the data rate of the channel. As a result, in asynchronous data transmission, the preamble method prevents binary data transfer. Certain characters could be sent as a preamble and would, therefore, not be used for the information content. For example, if bits are sent to a communications receiver in order to synchronize that receiver, then no data information is sent. Thus, the preamble system requires a preamble and prevents binary data transfer. If binary data is transmitted, there could be no start bit. The preamble system would not know the difference between a binary data bit or preamble bit. There could also never be a "sync" word in the binary transmission because it would mistake it for a frame signal. In the "avoidance of the first mode of operation," as noted before, a continuous transmission is required for randomized data. The automatic gain control system (AGC) solves the problem of amplitude fluctuations, but does not solve the problem of DC restoration. In an automatic gain control system, it is possible to correct the gain, but it cannot affect the DC reference point. Other prior art digital signal decoding and digital modulated signal reading devices are shown and disclosed in U.S. Pat. No. 5,052,021 to Goto et al., U.S. Pat. No. 4,823,360 to Tremblay et al., and U.S. Pat. No. 4,540,897 to Takaoka et al.

SUMMARY OF THE INVENTION

It is therefore an object of the present invention to provide an apparatus and method for decoding transmitted asynchronous data where the distance and loss characteristics of a communications channel are unknown and widely variable.

It is also an object of the present invention to recover digital information of an asynchronous digital data communication system in a wire line, fiber optic, or radio receiver with high dynamic range variations in the length loss.

The present invention is advantageous because it now provides long term circuit stability and accomplishes high dynamic range burst mode asynchronous data decision decoding of asynchronous data communication signals with relatively long periods of absent data without losing a reference. It is possible to use the decoding apparatus and method of the present invention in any product that sends asynchronous digital data over a wire line, radio, or fiber optic communication channel where the distance and loss characteristics of the channel are unknown or widely variable.

In accordance with the present invention, asynchronous data signals are digitally decoded by measuring the amplitude of a signal bit having negative and positive peak values, and digitally computing a mid-bit reference from the signal bit. Changes in the base band signal peak excursions are tracked and the mid-bit reference is updated from the tracked changes of the base band signal excursions. To track thermal drifts and components aging, the positive and negative peak registers are periodically decremented and incremented, respectfully, at a rate several orders of magnitude slower than the ADC sample rate.

In one detailed aspect of the present invention, the apparatus digitally decodes asynchronous communication signals and includes an analog-to-digital converter for converting analog communication signals having negative and positive signal peaks into binary signal values corresponding to the analog communication signals. A negative peak register and a positive peak register store negative and positive peak signal values and the minimum negative and maximum positive signal values corresponding to the minimum, most negative peak signal value and the maximum, most positive signal value. A negative peak comparator and a positive peak comparator compare the positive and negative signal peaks of a currently received binary signal value with the minimum negative and maximum positive peak signal value stored within the negative and positive peak registers so as to update the negative and positive peak registers with any new minimum negative and maximum positive peak signal values.

A subtraction circuit subtracts the positive peak signal value from the negative peak signal value to determine the magnitude signal value corresponding to the difference between a binary zero and one of the binary signal values. An addition circuit adds one-half of the magnitude signal value to the minimum negative peak signal value stored in the negative peak register to obtain a threshold signal value used to determine the mid-bit reference.

In still another aspect of the present invention, the analog-to-digital converter converts an analog communication signal into an N-bit value. The N-bit value can comprise a 12-bit value. A threshold register also stores the threshold signal value. A threshold comparator compares the threshold signal value to a currently received binary signal value corresponding to a currently received and converted analog communication signal. A circuit latch can also be included for latching a single bit from an N-bit value. An analog-to-digital buffer register can store the binary signal values that have been converted from the analog communication signals.

In a detailed method aspect of the present invention, the method of the present invention digitally decodes asynchronous communication signals, and comprises the steps of converting analog communication signals having negative and positive peak values into binary digital signal values. The method also comprises the step of storing in respective negative and positive peak registers at least the negative and positive peak signal values. The method further comprises the step of comparing the negative and positive peak signal values of a currently received binary signal value with the minimum negative and maximum positive peak signal values stored within the negative and positive peak registers, and updating the negative and positive peak registers with the new minimum negative and maximum positive peak signal values when the comparison step determines that there is a new minimum negative or maximum positive peak signal value.

The magnitude signal value corresponding to the peak-to-peak signal excursion is also determined in a subtraction circuit by determining the difference between a digital one and digital zero. The minimum negative peak signal value stored in the negative peak register is added to one-half of the magnitude signal value, resulting in a threshold signal value.

The method further comprises the step of initially measuring the amplitude of the signal start bit. The peak-to-peak excursion is calculated and half of that calculated peak-to-peak excursion value is added to the minimum measured value corresponding to the minimum negative peak signal value to obtain a mid-bit reference.

In still another method aspect of the present invention, the method includes the step of tracking changes of base band signal peak excursions by measuring the currently received or "sampled" negative and positive peak signal values and comparing those negative and positive peak signal values with previously determined minimum negative and maximum positive peak signal values that are stored within respective negative and positive peak registers. The analog communication signals are converted into a binary signal values with the analog-to-digital converter and stored in an analog-to-digital buffer register. The analog communication sample can be oversampled by about ten times.

The method also comprises the step of converting the analog communication signal into an N-bit value that typically is a 12-bit value. The method also includes the steps of decrementing the positive peak register and incrementing the negative peak register periodically, which in one aspect of the present invention, is about one Hz rate. The method also includes the steps of determining the magnitude signal value corresponding to the difference between a binary zero and one and the binary digital signal by subtracting the positive peak signal value from the negative peak signal value and dividing the magnitude value by two within the division circuit and then adding the result of the division step to a minimum negative peak signal value that is stored within the negative peak register.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The present invention is advantageous because it now allows a high dynamic range for decoding asynchronous digital data and the increased stability of digital computational circuits. The apparatus and method of the present invention can be used with any product that sends asynchronous digital data over a wire line, radio, or fiber optic communication channel, where the distance and loss characteristics of the channel are unknown or widely variable. In accordance with the present invention, the amplitude of a signal bit having negative and positive peak values is determined, followed by digitally computing a mid-bit reference based on the mid-bit determination. Changes of base band signal peak excursions are tracked and the mid-bit reference is updated from the tracked changes of the base band signal peak excursions.

The apparatus includes a negative peak register and positive peak register for storing the negative and positive peak signal values and the minimum negative and maximum positive peak signal values corresponding to the minimum, most negative peak signal value and the maximum, most positive signal value. A negative peak comparator and positive peak comparator compares the positive and negative peak signal values of a currently received binary bit signal with the minimum negative and maximum positive peak signal values stored within the negative and positive peak registers, and updates the negative and positive peak registers with any new minimum negative and maximum positive peak signal values. An addition circuit adds one-half of the magnitude signal value of a binary signal to the minimum negative peak signal value stored in the negative peak register to obtain a threshold signal value that is then used to update the mid-bit reference.

FIG. 1 illustrates a graphical representation of an asynchronous data frame transmission shown at 10, with a delay that causes a time delay problem that the apparatus and method of the present invention solves adequately. As shown in FIG. 1, asynchronous data communication signals send data in bursts and are not time oriented. For example, a first frame 12 could include a start bit 14 and stop bit 16, with data bits (D) located between the start and stop bit 14,16. The transmission then may have a two minute delay 18 followed by a second frame 20 having a start bit 22 and stop bit 22 and data (D) located between start and stop bits 22,24.

In order to decode the incoming data correctly, knowledge of the data amplitude must be known in order to establish a reference in a communications receiver. The communications receiver should also be capable of performing DC restoration during potentially long quiet periods, such as the illustrated two minute delay 18. As noted before, the present invention solves this problem as compared to those prior art systems that use (a) a preamble to reduce the data rate of a channel, (b) a continuous transmission, or (c) an automatic gain control to solve amplitude fluctuations, but not DC restoration.

Figure 2:
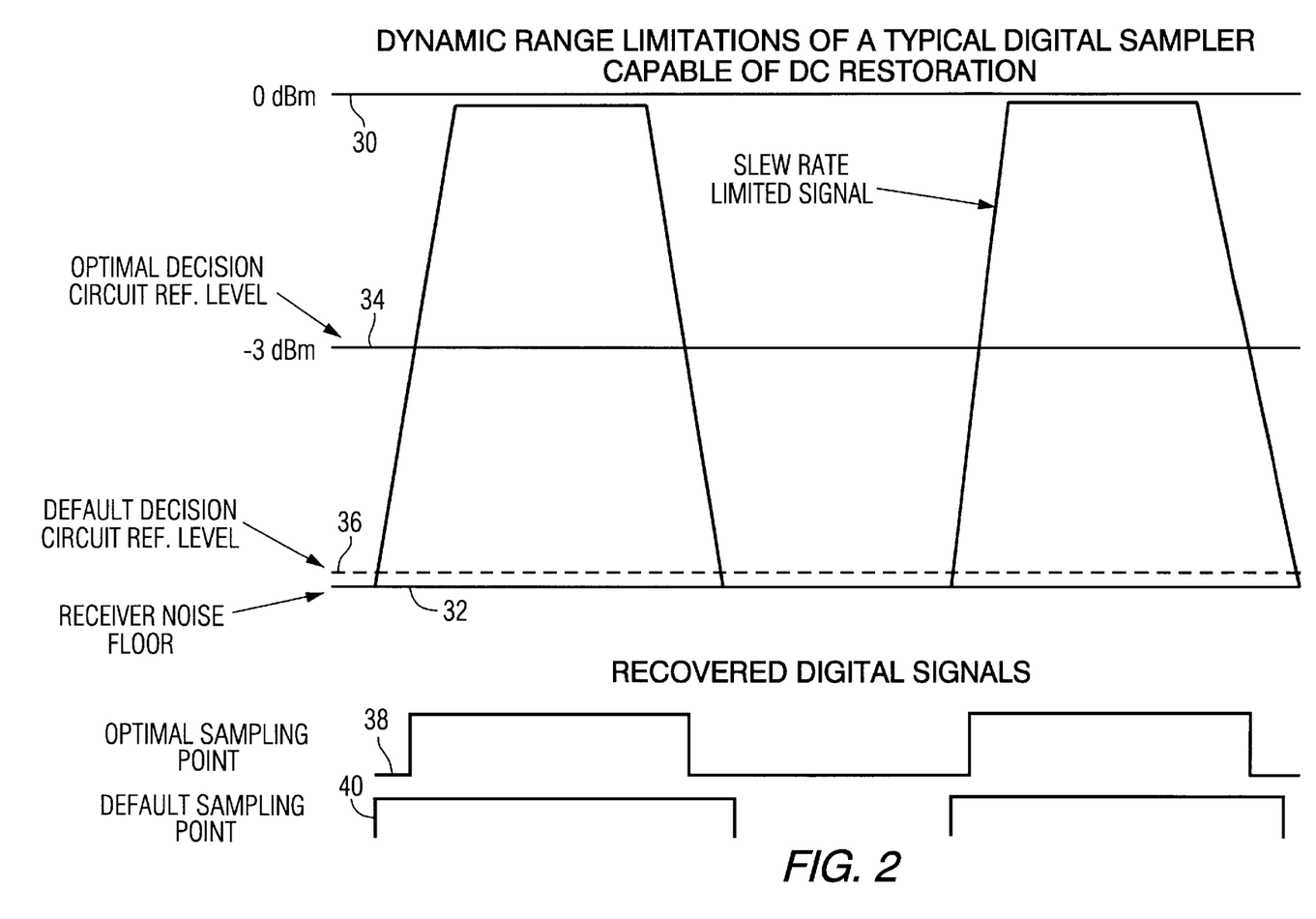
FIG. 2 is a graph showing the dynamic range limitations of a typical digital sampler that is capable of DC restoration with an optimal decision circuit reference level and a default decision circuit reference level where the receiver noise floor is shown by the bottom line.

FIG. 2 illustrates a graphical representation of the dynamic range limitations of a typical digital sampler capable of DC restoration. The zero decibel (dBm) line 30 may represent a five volt signal corresponding to a logic level 1, while the logic level 0 at receiver noise floor line 32 could be zero volts and correspond to negative six (−6) decibels. Thus, the optimal decision circuit reference level would be about negative three (−3) decibels at the optimal decision circuit reference level line 34, corresponding to 2.5 volts.

This type of system could be applicable to a fiber optic communication system. The optimal decision circuit reference level 34 is applicable to a short length line or short wire where the same signal would be received with little or no attenuation. Thus, it is possible to use a 2.5 volt reference level, or one-half of the digital five volt level on transmission. If the communication link is "loose," then the signal will be attenuated and the reference would have to be below the negative three (−3) decibel line 34. If it is desirable for this system to work in both situations (i.e., the shorter or longer line), it would then be necessary to place the decision level toward the minimum or "bottom" where the default decision level is located, such as at the default decision circuit reference level indicated by dotted line 36. Thus, it would be possible to work in both situations, i.e., with the short link length with little or no signal attenuation, and the long link length with the much signal attenuation. The graph also shows receiver digital signals for the optimal sampling point at 38 and for the default sampling point at 40.

As noted before, the technical drawback occurs where the waveforms appear at the bottom or the "ideal" or optimal sampling point, which would have a 50% duty cycle. If the default line 36 is used, then the pulse width modulation or distortion would occur because of finite rise times and fall times of signals.

Figure 3:
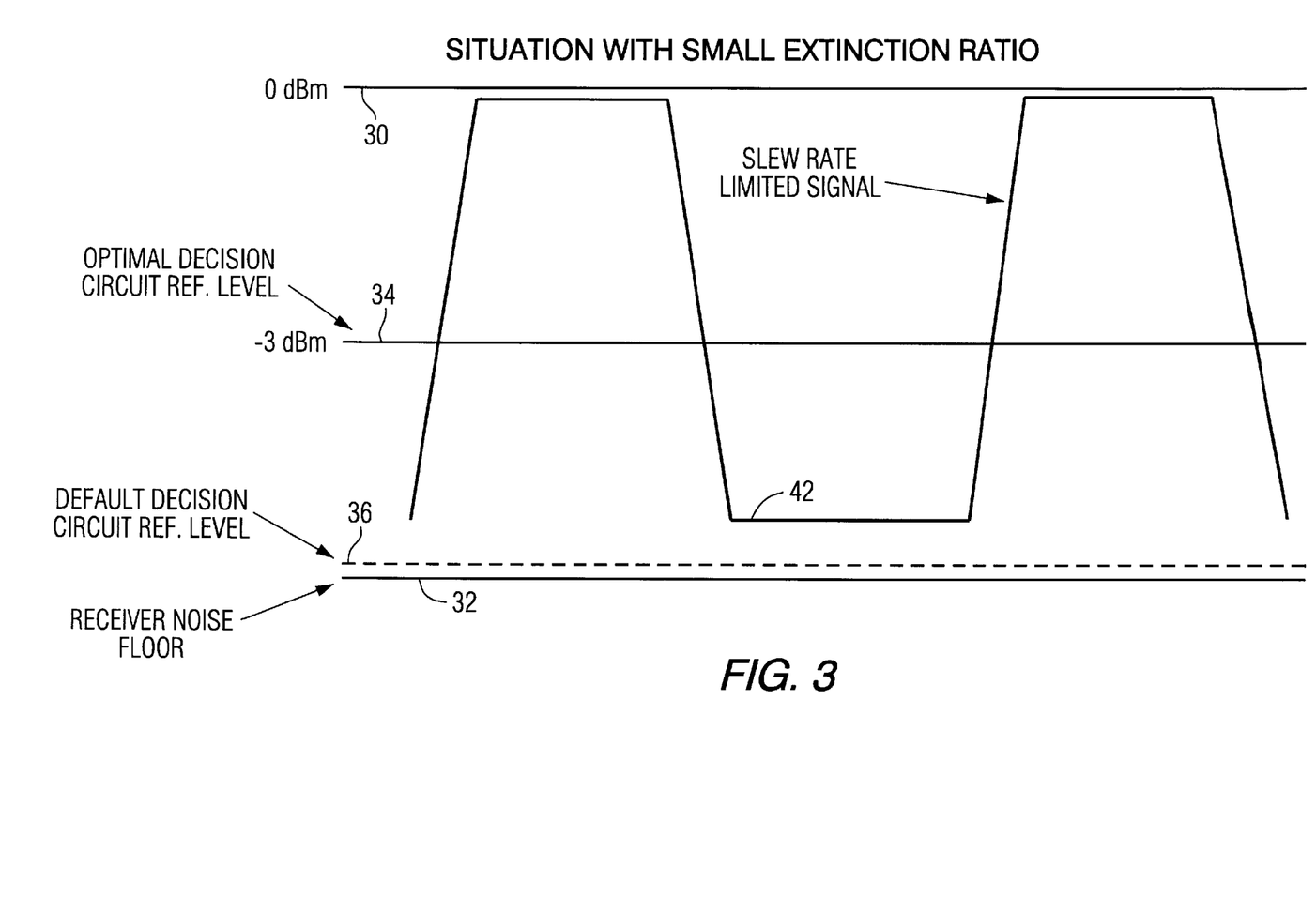
FIG. 3 is a graph similar to the graph of FIG. 2, but showing a signal with a small extinction ratio.

FIG. 3 is another graph similar to FIG. 2, but showing the situation with a small extinction ratio. The term "small extinction ratio" is often used in fiber optic communication systems and points to the relative difference between a "light" state and a "dark" state. If there was a default decision circuit reference level as indicated at 36, and there was a finite extinction ratio, it would never be totally dark, i.e., the signal would never cross that level as shown by the bottom 42 of the signal, which is above the default line 36. It is evident that it is important to determine the positive level and the negative level and place the threshold in the middle. The extinction ratio is usually defined as a minimum value.

The present design of this invention allows the reference point or threshold to be dynamic and depends on the amplitude. The present invention places the reference midway such that the apparatus and method always measures the peak corresponding to the positive peak signal value and negative peak signal value and places the decision level in the middle of the two.

Figure 4:
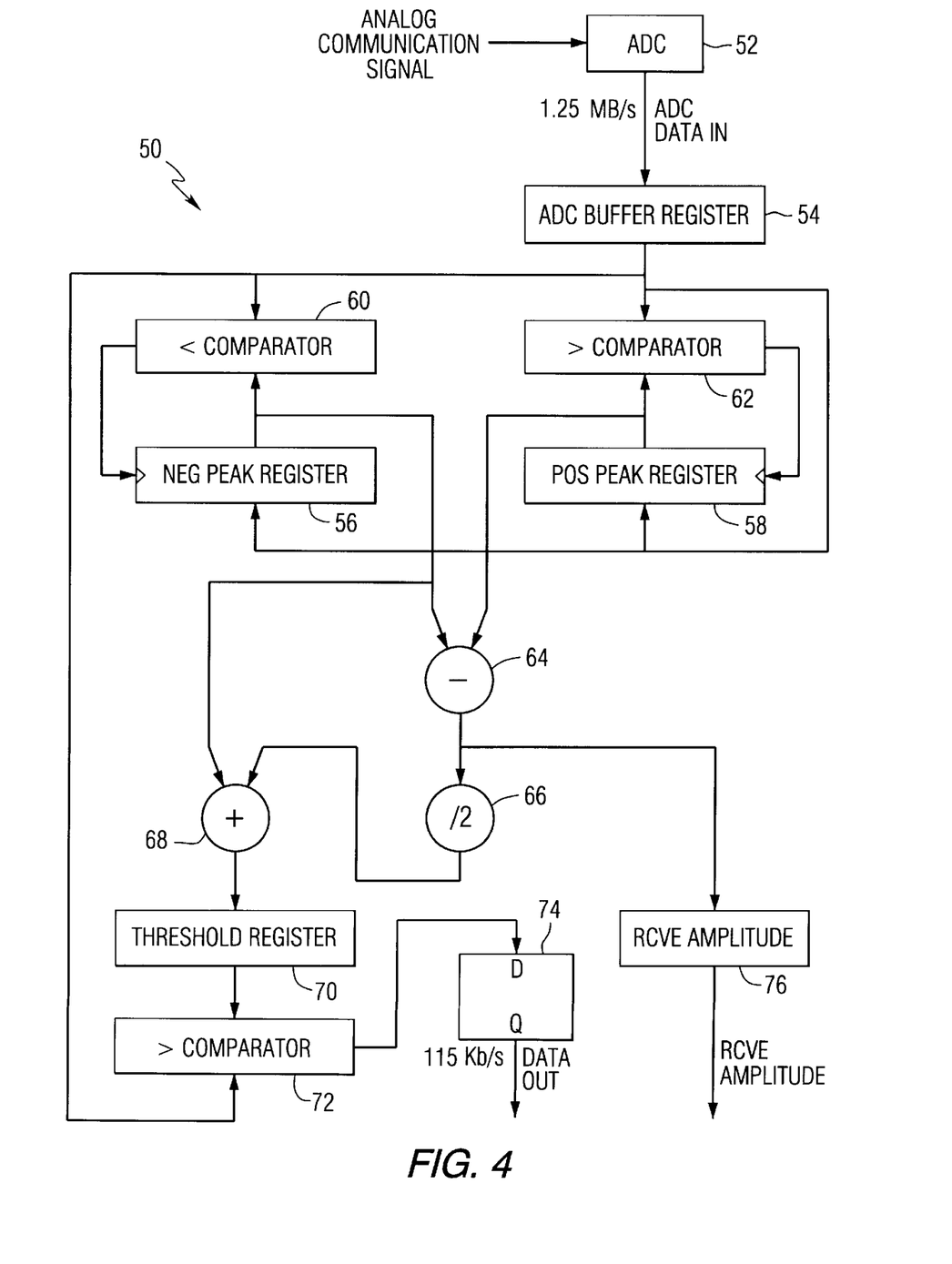
FIG. 4 is a block diagram of the apparatus for digitally decoding asynchronous signals in accordance with the present invention.

FIG. 4 illustrates a high level block diagram of the apparatus 50 of the present invention, which can be implemented by those design and manufacturing techniques known to those skilled in the art. As illustrated, an analog communication signal that is part of an asynchronous communication transmission passes into an analog-to-digital converter (ADC) 52. Oversampling by the ADC 52 can occur by about ten times, and in the illustrated example, the analog-to-digital converter 52 converts the analog communication signals into binary signal values corresponding to the analog communication signals that have negative and positive peak values for the data information. The binary signal values pass from the ADC 52 in the illustrated embodiment at about 1.25 MB/s, and are stored within the analog-to-digital converter buffer register 54. Although 1.25 MB/s transmission rate is illustrated, any data rate convenient for implementation of the invention as known to those skilled in the art is possible. It should be understood that the present invention does not require a frame preamble, and the first bit of data can be a signal start bit.

The negative and positive peak signal values of the binary signal values are computed by techniques known to those skilled in the art, and stored within a respective negative peak register 56 and a positive peak register 58. As the process continues, a negative peak comparator 60 and positive peak comparator 62 compares the positive and negative peak signal values of a currently received binary signal value with the most negative (the minimum) and most positive (the maximum) peak signal values stored within the negative and positive peak registers, and updates the negative peak register 56 and positive peak register 58 if the current positive and negative peak signal value represent a new minimum negative or maximum positive peak value. The registers are updated accordingly by methods and logical circuit implementations known to those skilled in the art. To track thermal drifts and component aging, the positive and negative peak registers are periodically decremented and incremented, respectfully, at a rate several orders of magnitude slower than the analog-to-digital converter sample rate. In one aspect of the invention, the period for the registers could be 1 Hz.

A subtraction circuit 64, working by an operation well known to those skilled in the art, subtracts the positive peak signal value from the negative peak signal value to determine the magnitude signal value corresponding to the difference between a binary zero and one of the binary signal values of the converted analog communication signal. This value then is divided by two within a division circuit 66 to determine the half-magnitude signal value. This one-half magnitude signal value is then added in an addition circuit 68 with the minimum negative peak signal value that is stored in the negative peak register 56 to obtain a threshold signal value. This is shown by the line descending from the negative peak register 56 that then splits and extends to the subtraction circuit 64 and the addition circuit 68.

This threshold signal value is stored within a threshold register 70. This value is used to determine the mid-bit reference. A threshold comparator 72 receives the currently sampled binary signal value from the analog-to-digital converter buffer register 54 and compares that value with the threshold signal value from the threshold register 70. Thus, there occurs a mathematical comparison of the calculated threshold signal value to the currently sampled binary signal value to decide whether the result is greater or less than the computed threshold level as defined by the threshold signal value.

After the comparison, the signal enters the DQ latch 74 that latches a single bit. Thus, the signal is mathematically computed from a 12-bit value (or other N-bit value) to one bit output. The circuit makes the decision whether the comparison is greater than the value in the threshold register 70 or less than that value. Data is transmitted out of the DQ latch 74 at about the reduced rate of 115 KB/s, as compared to the circuit input rate noted above of 1.25 MB/s. Naturally, the data output can vary depending on final design choices made by those skilled in the art. From the subtraction circuit 64, the signal also passes into a receiver amplitude circuit 76 before it is divided. This circuit 76 acts as a diagnostic of the 12-bit value that tells the difference or number of least significant bits (LSB) between a one and zero with the peak-to-peak amplitude signal out.

Figure 5:
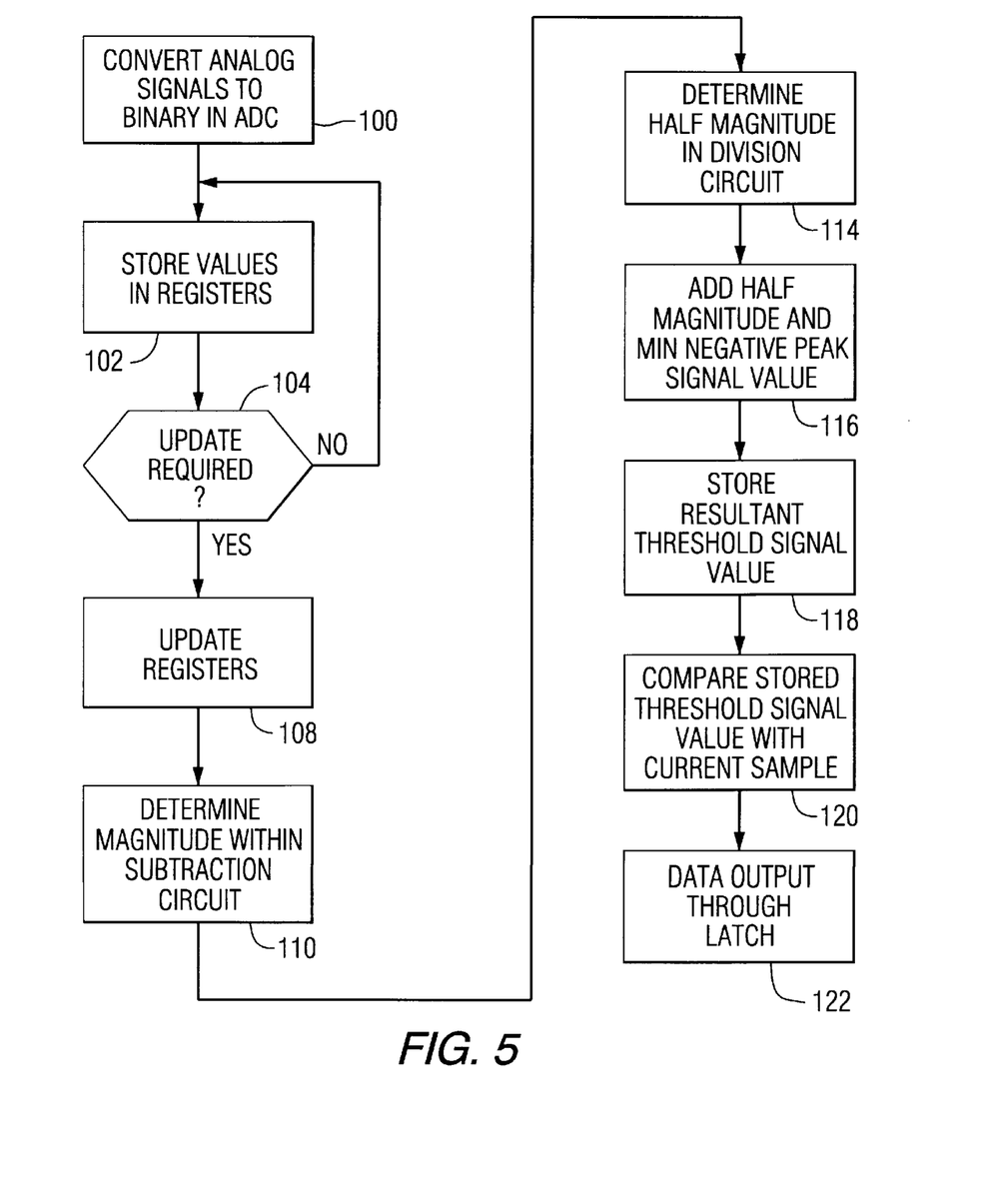
FIG. 5 is a flow chart illustrating the basic method for digitally decoding asynchronous data signals of the present invention.

FIG. 5 illustrates a basic flow chart of the workings of the apparatus 50. At block 100, analog-to-digital communication signals are converted into binary signal values. The negative and positive peak signal values are stored within the negative peak register 56 and positive peak register 58 at block 102. The comparators 60,62 compare those negative and positive peak signal values with the minimum negative and maximum positive peak signal values stored within those registers at block 104. If the negative and positive peak signal values are either more positive or more negative than what is stored for the minimum or maximum peak signal values, the negative and positive peak registers are updated with the new maximum or minimum values (block 108). If not, the process continues as a loop until the update. The subtraction circuit at block 110 subtracts the positive peak signal value from the negative peak signal value to determine the magnitude signal value. At block 114, the division circuit determines the half magnitude, which is then added in the addition circuit at block 116 to the minimum negative peak signal value stored in the negative peak register. The resultant threshold signal value is stored within the threshold register at block 118, and then compared at block 120 with the currently sampled binary signal value to determine the mid-bit reference. The signal then passes into the latch at block 122.

The present invention also has technical benefits. It can be used in a communication program using a high dynamic range (55 DB) fiber optic receiver that is capable of receiving universal asynchronous receiver transmitter (UART) data over fiber optic links from 0–200 KM in length with no adjustments. Also, it can receive the first transmitted bit after a quiet period of several minutes in duration without the necessity of having a preamble. The present invention also makes it possible to have a low duty cycle transmission system, which can operate from low power.

The present invention is also advantageous because it is possible to send universal asynchronous receiver transmitter (UART) data from commercial off the shelf (COTS) serial ports over communication links where there is no prior knowledge of the link budget. It also is possible to compensate for component aging and thermal stress and maintain an optimum decision reference. Thus, it can be implemented in very low power fiber optic communication systems and RS-232 data can be sent from COTS equipment over communication links of unknown length.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. An apparatus for digitally decoding asynchronous communication signals comprising:
   an analog-to-digital converter for converting analog communication signals having negative and positive signal peaks into binary signal values corresponding to the analog communication signals;
   a negative peak register and a positive peak register for storing the negative and positive peak signal values and the minimum negative and maximum positive signal values corresponding to the minimum, most negative peak signal value and the maximum, most positive peak signal value;
   a negative peak comparator and a positive peak comparator for comparing the positive and negative peak signal values of a currently received binary signal value with the minimum negative and maximum positive peak signal values stored within the negative and positive peak registers so as to update the negative and positive peak registers with new minimum negative and maximum positive peak signal values;
   a subtraction circuit for subtracting the positive peak signal value from the negative peak signal value to determine the magnitude signal value corresponding to the difference between a binary zero and one of the binary signal value; and
   an addition circuit for adding one half of the magnitude signal value to the minimum negative peak signal value stored in the negative peak register to obtain a threshold signal value to determine a mid-bit reference.

2. An apparatus according to claim 1, and further comprising an analog-to-digital converter for converting the analog communication signal into an N-bit value.

3. An apparatus according to claim 2, wherein said analog-to-digital converter converts an analog communication signal into a 12-bit value.

4. An apparatus according to claim 2, and further comprising a circuit latch for latching a single bit from an N-bit value.

5. An apparatus according to claim 1, and further comprising a threshold register for storing the threshold signal value.

6. An apparatus according to claim 5, and further comprising a threshold comparator for comparing the threshold signal value to a currently received binary signal value.

7. An apparatus according to claim 1, and further comprising an analog-to-digital buffer register for storing the binary signal values.

8. An apparatus for digitally decoding asynchronous data signals comprising:
   means for measuring the amplitude of a signal bit having negative and positive peak signal values;
   means for digitally computing a mid-bit reference from the signal bit;
   means for tracking changes of base band signal peak excursions;
   means for updating the mid-bit reference from the tracked changes of base band signal peak excursions; and
   a subtraction circuit for subtracting the positive peak signal value from the negative peak signal value to determine the magnitude signal value corresponding to the difference between a binary zero and one of the signal bit.

9. An apparatus according to claim 8, and further comprising an analog-to-digital converter for converting an analog signal into an N-bit value.

10. An apparatus according to claim 9, wherein said analog-to-digital converter converts an analog signal into a 12-bit value.

11. An apparatus according to claim 8, and further comprising a negative peak register and a positive peak register for storing the negative and positive peak signal values and the minimum negative and maximum positive peak signal values corresponding to the minimum, most negative peak signal value and the maximum, most positive signal value, and a negative peak comparator and a positive peak comparator for comparing the positive and negative peak signal values of a currently received signal bit with the minimum negative and maximum positive peak signal values stored within the negative and positive peak registers.

12. An apparatus according to claim 8, and further comprising an addition circuit for adding the minimum negative peak signal value to one-half of the magnitude signal value for obtaining a threshold signal value.

13. An apparatus according to claim 8, and further comprising a threshold register for storing the threshold signal value.

14. An apparatus according to claim 8, and further comprising a threshold comparator for comparing the threshold signal value to a currently received signal bit.

15. An apparatus according to claim 9, and further comprising a circuit latch for latching a single bit from an N-bit value.

16. An apparatus according to claim 9, and further comprising an analog-to-digital buffer register for storing an N-bit value.

17. A method of digitally decoding asynchronous data signals comprising the steps of:
   measuring the amplitude of a signal bit having negative and positive peak signal values;
   digitally computing a mid-bit reference;
   tracking changes of base band signal peak excursions;
   updating the mid-bit reference from the tracked changes of base band signal peak excursions; and
   comparing a currently sampled positive peak signal value with a previously determined maximum positive peak signal value that is stored within a positive peak register and updating the maximum positive peak signal value in the positive peak register if the comparison step determines that a new maximum peak signal value exists.

18. A method according to claim 17, and further comprising the step of initially measuring the amplitude of a signal start bit.

19. A method according to claim 17, and further comprising the step of calculating the peak-to-peak excursion of a signal bit and adding half that calculated peak-to-peak excursion value to the minimum negative peak signal value to obtain a mid-bit reference.

20. A method according to claim 17, and further comprising the steps of tracking changes of base band signal peak excursions by determining the signal for negative and positive peak signal values of a currently received signal bit and comparing the negative and positive peak signal values with previously determined minimum negative and maximum positive peak signal values that are stored within respective negative and positive peak registers.

21. A method according to claim 17, and further comprising the step of converting an analog data signal into a binary signal value within an analog-to-digital converter and storing the binary signal value in an analog-to-digital buffer register.

22. A method according to claim 21, and further comprising the step of over sampling the analog data signal by about ten times.

23. A method according to claim 21, and further comprising the step of converting the analog data signal into an N-bit value.

24. A method according to claim 21, and further comprising the step of converting the analog data signal into a 12-bit value.

25. A method according to claim 17, and further comprising the step of comparing a currently sampled negative peak signal value with a previously determined minimum negative peak signal value that is stored within a negative peak register and updating the minimum negative peak signal value in the negative peak register if the comparison step determines that a new minimum negative signal peak value exists.

26. A method according to claim 21, and further comprising the steps of decrementing the positive peak register and incrementing the negative peak register at a rate of several orders of magnitude slower than a sample rate in the analog-to-digital converter.

27. A method according to claim 17, and further comprising the steps of:
determining the magnitude signal value corresponding to the difference between a binary zero and one within a subtraction circuit by subtracting the positive peak signal value from the negative peak signal value;
dividing the magnitude signal value by two within a division circuit; and
adding the result of the division step to a minimum negative peak signal value that is stored within a negative peak register to determine a threshold signal value.

28. A method of digitally decoding asynchronous communication signals comprising the steps of:
converting analog communication signals having negative and positive peak values into binary signal values;
storing in respective negative and positive peak registers the negative and positive peak signal values;
comparing the negative and positive peak signal values of a currently received binary signal value with minimum negative peak signal value and maximum positive peak signal value stored within the negative and positive peak registers;
updating the negative and positive peak registers with new minimum negative and maximum positive peak signal values if there is a new minimum negative or maximum positive peak signal value;
determining the magnitude signal value corresponding to the peak-to-peak excursion difference between a digital one and digital zero of the converted analog communication signal; and
adding the minimum negative peak signal value within the negative peak register to one-half of the magnitude signal value resulting in a threshold signal value.

29. A method according to claim 28, and further comprising the step of initially measuring the amplitude of a signal start bit.

30. A method according to claim 28, and further comprising the step of calculating the peak-to-peak excursion value of a binary signal value and adding half that calculated peak-to-peak excursion value to the minimum negative peak signal value to obtain a mid-bit reference.

31. A method according to claim 28, and further comprising the steps of tracking changes of base band signal peak excursions by comparing the currently measured negative and positive peak signal values with previously determined minimum negative and maximum positive peak signal values that are stored within respective negative and positive peak registers.

32. A method according to claim 28, and further comprising the step of converting an analog communication signal into a binary signal value with an analog-to-digital converter and storing the binary signal value in an analog-to-digital buffer register.

33. A method according to claim 32, and further comprising the step of over sampling the analog communication signal by about ten times.

34. A method according to claim 32, and further comprising the step of converting the analog communication signal into an N-bit value.

35. A method according to claim 34, and further comprising the step of converting the analog signal into a 12-bit value.

36. A method according to claim 28, and further comprising the step of comparing a currently sampled positive peak signal value with a previously determined maximum positive peak signal value that is stored within the positive peak register and updating the positive peak register if the comparison step determines that a new maximum positive peak signal value exists.

37. A method according to claim 28, and further comprising the step of comparing a currently sampled negative peak signal value with a previously determined minimum negative peak signal value that is stored within the negative peak register and updating the negative peak register if the comparison step determines that a new minimum negative peak signal value exists.

38. A method according to claim 28, and further comprising the steps of decrementing the positive peak register and incrementing the negative peak register at a rate of several orders of magnitude slower than a sample rate in the analog-to-digital converter.

39. A method according to claim 28, and further comprising the steps of:
determining the magnitude signal value corresponding to the difference between a binary zone and one of the binary digital signal by subtracting the positive peak signal value from the negative peak signal value;
dividing the magnitude signal value by two within a division circuit; and
adding the result of the division step to a minimum negative peak signal value that is stored within the negative register to determine a threshold signal value.

* * * * *